(12) United States Patent
Ramanathan et al.

(10) Patent No.: US 11,587,843 B2
(45) Date of Patent: Feb. 21, 2023

(54) THERMAL BUMP NETWORKS FOR INTEGRATED CIRCUIT DEVICE ASSEMBLIES

(71) Applicant: Intel Corporation, Santa Clara, CA (US)

(72) Inventors: Prasad Ramanathan, Chandler, AZ (US); Nicholas Neal, Gilbert, AZ (US); Chandra Mohan Jha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 920 days.

(21) Appl. No.: 16/219,158

(22) Filed: Dec. 13, 2018

(65) Prior Publication Data

US 2020/0194330 A1 Jun. 18, 2020

(51) Int. Cl.
| | |
|---|---|
| *H01L 23/34* | (2006.01) |
| *H01L 23/52* | (2006.01) |
| *H01L 23/367* | (2006.01) |
| *H01L 23/498* | (2006.01) |
| *H01L 23/522* | (2006.01) |
| *H01L 23/538* | (2006.01) |
| *H01L 23/00* | (2006.01) |
| *H01L 23/373* | (2006.01) |

(52) U.S. Cl.
CPC ........ *H01L 23/367* (2013.01); *H01L 23/3735* (2013.01); *H01L 23/49816* (2013.01); *H01L 23/49827* (2013.01); *H01L 23/5226* (2013.01); *H01L 23/5386* (2013.01); *H01L 24/11* (2013.01); *H01L 24/13* (2013.01); *H01L 24/17* (2013.01); *H01L 2224/0401* (2013.01); *H01L 2924/01029* (2013.01); *H01L 2924/15311* (2013.01)

(58) Field of Classification Search
CPC ............... H01L 23/367; H01L 23/3735; H01L 23/49816; H01L 23/49827; H01L 23/5226; H01L 23/5386; H01L 24/11; H01L 24/13; H01L 24/17; H01L 2224/0401; H01L 2924/15311; H01L 24/29; H01L 24/32; H01L 24/03; H01L 24/05; H01L 24/81
USPC ........................................................ 257/713
See application file for complete search history.

(56) References Cited

U.S. PATENT DOCUMENTS

| | | | | |
|---|---|---|---|---|
| 2016/0064328 A1* | 3/2016 | Kwon | ................. | H01L 25/0652 438/109 |
| 2020/0152546 A1* | 5/2020 | Refai-Ahmed | ....... | H01L 23/481 |

* cited by examiner

*Primary Examiner* — Theresa T Doan
(74) *Attorney, Agent, or Firm* — Essential Patents Group, LLP.

(57) ABSTRACT

Integrated circuit IC package with one or more IC dies including solder features that are thermally coupled to the IC. The thermally coupled solder features (e.g., bumps) may be electrically insulated from solder features electrically coupled to the IC, but interconnected with each other by one or more metallization layers within a plane of the IC package. An in-plane interconnected network of thermal solder features may improve lateral heat transfer, for example spreading heat from one or more hotspots on the IC die. An under-bump metallization (UBM) may interconnect two or more thermal solder features. A through-substrate via (TSV) metallization may interconnect two or more thermal solder features. A stack of IC dies may include thermal solder features interconnected by metallization within one or more planes of the stack.

20 Claims, 8 Drawing Sheets

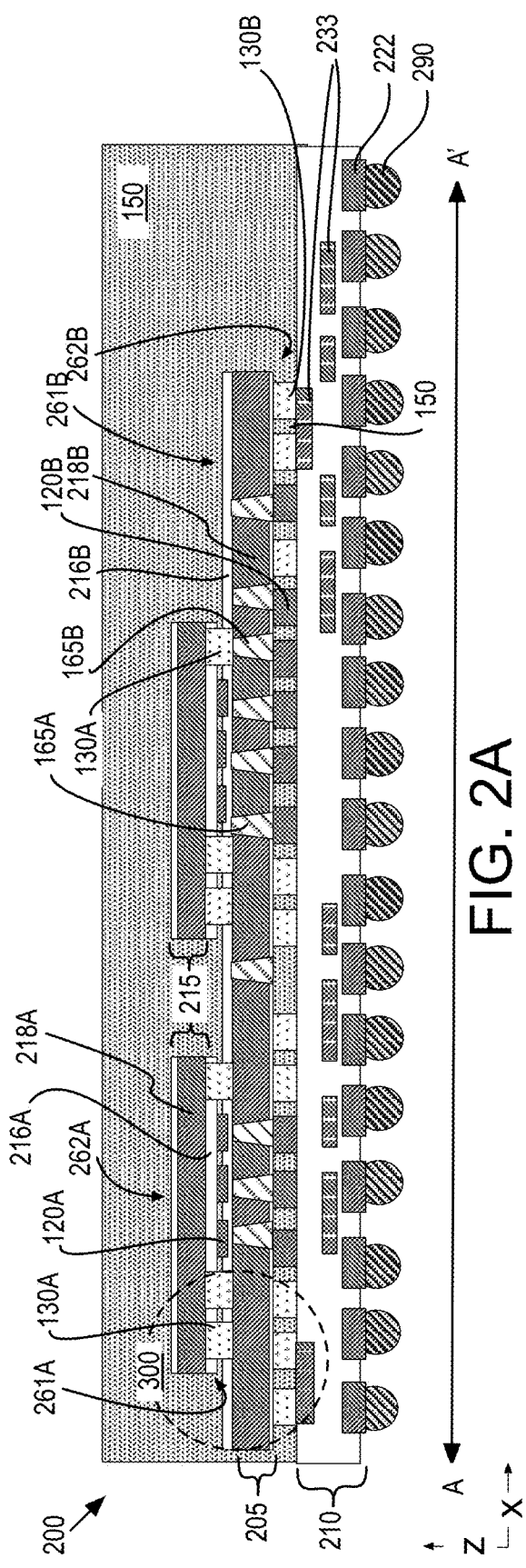
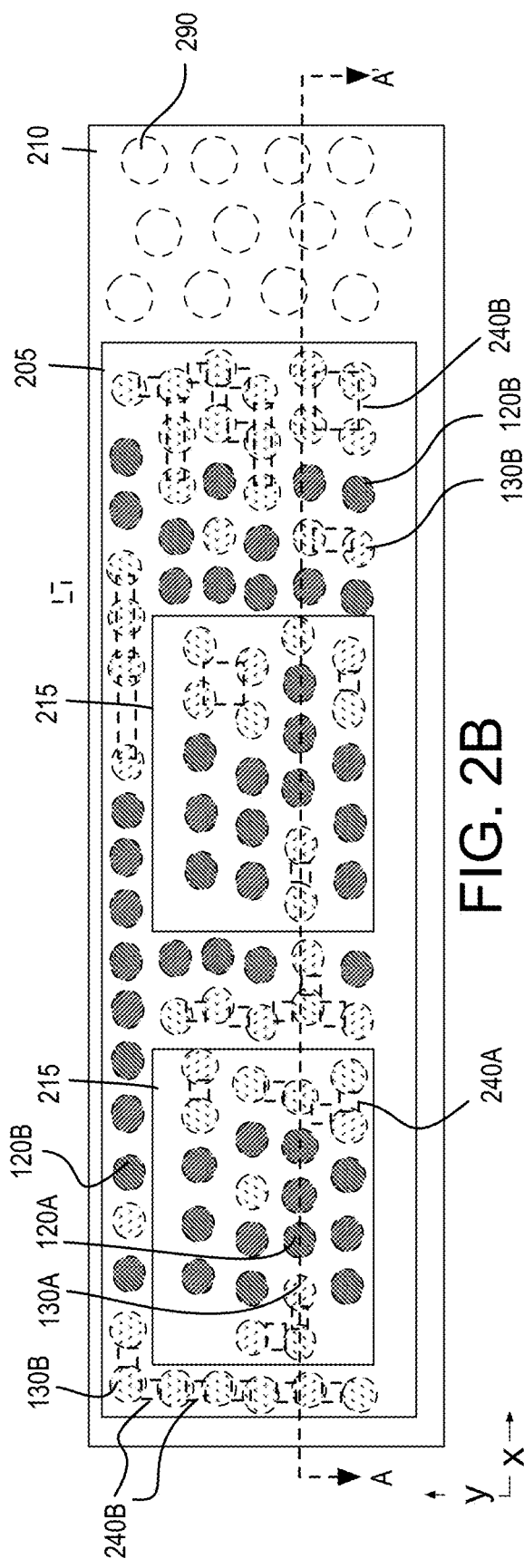
FIG. 2A
FIG. 2B

THERMAL BUMP NETWORKS FOR INTEGRATED CIRCUIT DEVICE ASSEMBLIES

BACKGROUND

In electronics manufacturing, integrated circuit (IC) packaging is a stage of semiconductor device fabrication, in which an IC that has been fabricated on a die (or chip) comprising a semiconducting material is encapsulated in a supporting case or "package" that can protect the IC from physical damage and support electrical contacts that connect the IC to a host circuit board or another package. In the IC industry, the process of fabricating a package is often referred to as packaging, or assembly.

3D packaging architectures integrate multiple components (e.g., IC die) vertically within a single package assembly. Within a 3D packaging architecture, IC die may be assembled in various manners. For example, a first IC die may include a ball grid array (BGA) or land grid array (LGA) of solder features, while a second IC die stacked on the first may be connected to the first IC die through additional BGA/LGA connections that may for example interface with through-substrate vias (TSVs). As another example, one or more of the IC dies may be in a flip-chip BGA (e.g., FCBGA) architecture while a back side of one of the dies may be connected to another IC die, interposer, or package substrate through another means, such as TSVs, or wire bonds.

3D packaging brings new challenges in thermal management, and as such, heat dissipation is now one of the primary areas of research in the assembly industry. To date much work has emphasized improving heat transfer between different planes of a package assembly (i.e., die-to-die heat transfer). Such work has often neglected, or even hindered, the heat transfer within planes of a package assembly (i.e., lateral heat transfer across a die). However, in-plane heat transfer is very important for package assemblies where one or more IC die are not in close thermal contact with a dedicated heat spreader.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments as they are presented for explanation only. Hence, the subject matter described herein is illustrated by way of example and not by way of limitation.

For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous element.

FIG. 2A is a cross-sectional view of a package assembly including thermal solder feature networks, in accordance with some embodiments;

FIG. 2B is a plan view of the package assembly illustrated in FIG. 2A, in accordance with some embodiments;

DETAILED DESCRIPTION

Figure 1:
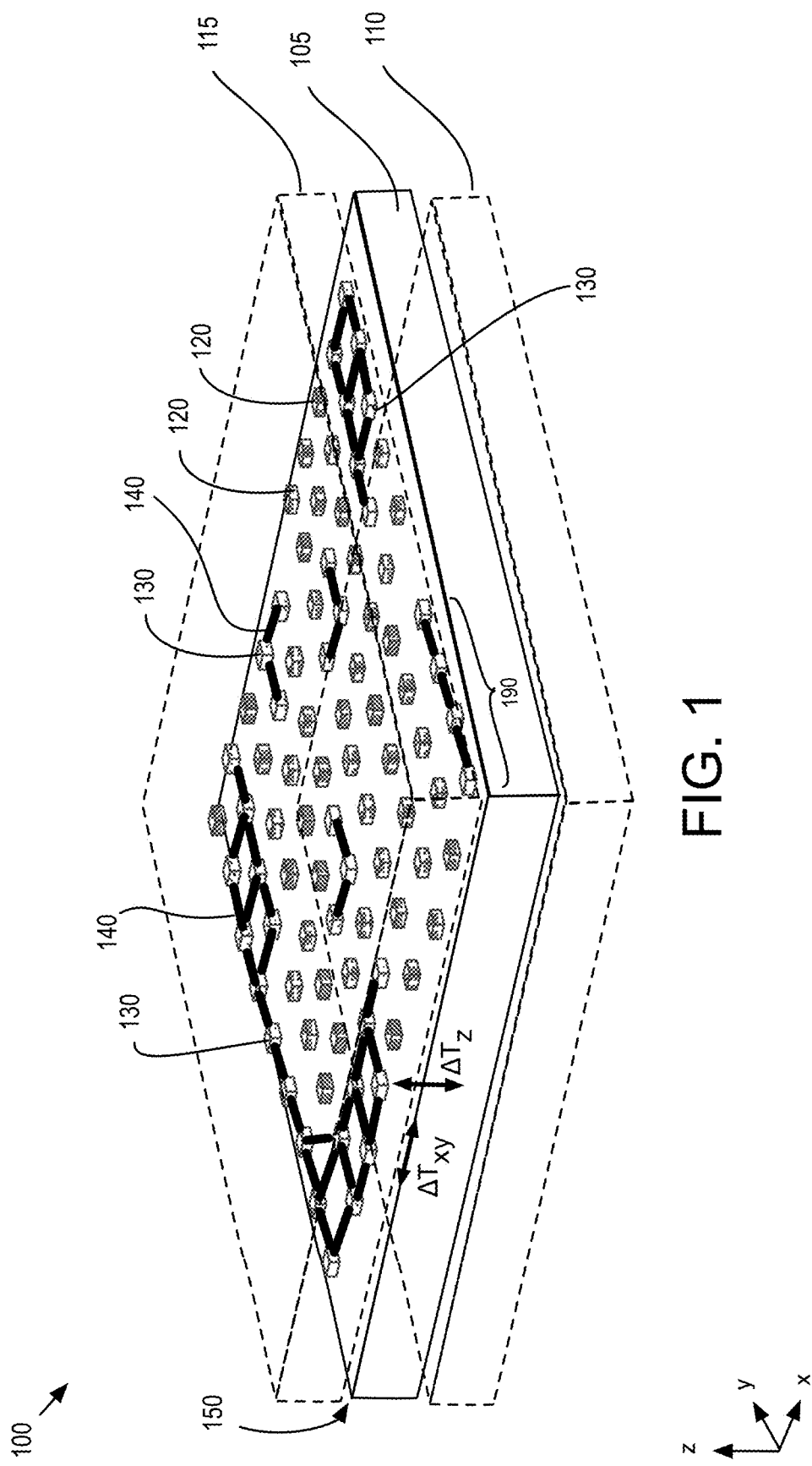
FIG. 1 is an isometric illustration of a 3D package architecture with thermal solder feature networks, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are examples of thermal solder feature networks, which may be employed within a package assembly (e.g., 3D architecture, or otherwise). Thermal solder feature networks may improve lateral heat transfer within a given plane of a package. Hotspots within a package plane may be reduced through lateral heat conduction along segments and/or pathways interconnecting the solder features into a network. Solder feature networks may comprise any number of solder features interconnected by one or more lateral thermal conduits. The thermal conduit(s) may improve thermal conductivity between adjacent solder features that may otherwise be surrounded by a dielectric material having relatively poor thermal conductivity. The thermal conduit(s) may link together multiple solder features and be operable as thermal energy conduits rather than electrical conduits. Dummy "thermal" solder features may be electrically insulated from "electrical" solder features such that thermal solder feature networking may be independent of an IC's electrical interconnection. Thermal solder features may also be part of a ground plane of a package assembly, and thus may be either electrically floating or electrically grounded. Heat conveyed by the thermal solder features between package assembly planes (e.g., to/from another IC die, interposer, or package substrate) may be laterally spread according to the in-plane interconnection of the thermal solder feature networks.

FIG. 1 is an isometric illustration of a 3D package assembly 100 with thermal solder feature networks 190, in accordance with some embodiments. As shown, package assembly 100 includes at least one IC die 105. IC die 105 is one plane within package assembly 100, and IC die 105 is coupled to one or more other package assembly planes 110, 115 through solder features. Package assembly planes 110, 115 may each be another IC die, a package interposer, or a package substrate, for example. In some embodiments, package assembly plane 115 is a second IC die, while package assembly plane 110 is an interposer or package substrate. In some other embodiments, package assembly plane 115 is a second IC die while package assembly plane 110 is a third IC die, either of which may be further assembled to another die, interposer, or package substrate (not depicted), etc.

In the illustrated example, IC die 105 is affixed to package assembly plane 115 by electrical solder features 120, and thermal solder features 130. Solder features 120, 130 may be any structure that includes a solder material, such as, but not limited to, a solder bump (e.g. reflowed solder), or a microbump (e.g., metal pillar capped with solder). Electrical solder features 120 are operable to convey electrical power (current and/or voltages) and/or I/O signals to/from an integrated circuit of IC die 105. In contrast, thermal solder features 130 are inoperable to convey electrical power (current and/or voltages) and/or I/O signals to/from any integrated circuit of IC die 105. For example, thermal solder features 130 may not be in electrical communication with any integrated circuit of IC die 105. In other words, thermal solder features 130 may be electrically insulated (isolated) from circuitry of IC die 105. Thermal solder features 130 are therefore also electrically insulated (isolated) from electrical solder features 120. Because solder has relatively high thermal conductivity, thermal solder features 130 may improve inter-plane temperature uniformity (i.e., reduce temperature difference $\Delta T_z$ between IC die 105 and package assembly plane 115).

In the example of package assembly 100, solder features 120, 130 may be on a front (top) side of IC die 105 (e.g., proximal to IC structures of IC die 105), or a back (bottom) side of IC die 105 (e.g., distal from integrated IC of IC die 105) with a thickness of semiconductor substrate between the IC structures and the solder features 120, 130. Although not depicted for the sake of clarity, solder features 120 and/or 130 may be present on both front and back sides of IC die 105. When coupled to the front side, electrical solder features 120 may be electrically coupled to IC structures of IC die 105 through a bond pad, or the like. When coupled to the back side, electrical solder features 120 may be electrically coupled to IC structures of IC die 105 by a TSV, or the like. The bond pad or TSV may therefore be considered part of the electrically active IC structure of IC die 105.

While solder features 130 may lack any interconnection with the electrically active IC structure of IC die 105, solder features 130 in accordance with at least some embodiments herein are nevertheless interconnected with each other. Thermal solder feature network 190 includes a plurality of solder features 130 that are interconnected through one or more in-plane thermal conduits 140 that extend a lateral (e.g., xy) distance within a plane of assembly 100. In the example shown in FIG. 1, thermal conduits 140 may be within the plane of IC die 105 (i.e. more proximal to IC die 105 than to package assembly plane 110). Alternatively, thermal conduits 140 may be more proximal to package assembly plane 110 than to IC die 105. In still other embodiments, thermal conduits 140 are implemented in both package assembly plane 110 and IC die 105 (i.e., parallel thermal conduits). Thermal conduits 140 may comprise any material(s) having higher thermal conductivity than surrounding materials, such as an underfill material occupying a remainder of a volume 150 between planes of package assembly 100. In some advantageous embodiments, thermal conduits 140 comprise a material having a thermal conductivity of at least an order of magnitude greater than surrounding materials. In some embodiments where surrounding materials comprise an underfill (e.g., <1 W/mK), and/or silicon nitride or oxynitride layer (e.g., <10 W/mK), thermal conduits 140 comprising a metal (e.g., >100 W/mK) offering a 10-100 fold improvement in thermal conductivity. Thermal conduits 140 may therefore improve in-plane temperature uniformity (i.e., reduce temperature difference $\Delta T_{xy}$ across IC die 105). As such, thermal solder feature networks 150 may facilitate lateral heat spreading away from hot spots that would otherwise be more localized to individual ones of thermal solder features 130. A number of thermal solder feature networks 150 are illustrated in FIG. 1. Various thermal solder feature networks 150 may comprise subsets of thermal solder features 130 that populate any areas/regions of IC die 105 where electrical connections are absent. Notably, not all thermal solder features 130 need be networked with others. Furthermore, one or more thermal solder feature networks 150 may be within each plane of a package assembly (e.g., additional networks may be within assembly planes 110 and 115, although not depicted).

In-plane thermal conduits 140 may be implemented in a number of manners according to a range of architectures, each of which may have structures indicative of the assembly technique(s) employed. In some stacked die examples further described below, thermal conduits 140 may be implemented in die-to-die contact areas with one or more layers of under bump metallization (UBM) interconnecting multiple thermal solder features 130. In some other embodiments, for example where a package substrate or interposer is to include thermal conduits 140, a non-signal interconnect (e.g., redistribution layer, etc.) may be directly connected to multiple solder features 130. Because thermal solder feature networks 150 may reduce total thermal resistance of package assembly 100, the range of applications for which package assembly 100 is suitable may be expanded, for example to include higher speed and power product segments.

In some embodiments, the interconnection between two IC dies includes networked thermal solder features. FIG. 2A is a cross-sectional view of a package assembly 200 including die-to-die thermal solder feature networks, in accordance with some embodiments. FIG. 2B is a plan view of the package assembly 200, in accordance with some further embodiments. Package assembly 200 includes multiple IC dies or chip(let)s 215 coupled to a host IC die 205. In this example, IC die 205 has a larger area, or footprint, than IC die 215. IC die 215 may include any integrated circuitry, such as, but not limited to, any system on a chip (SOC), application specific IC (ASIC), and/or electronic memory (e.g., DRAM, etc.) IC die 205 may likewise include any integrated circuitry, such as, but not limited to, a microprocessor, an SOC, an ASIC, and/or electronic memory.

Each IC die 215 has a front side 261A, and a back side 262A that is separated from front side 261A by a semiconductor substrate 218A (e.g., silicon, SiGe, Ge, Group III-Group V alloy, or Group III-Nitride, etc.) and front-side circuit structures 216A. Front-side circuit structures 216A include a semiconductor device layer, one or more intra-die interconnect metallization levels, and a passivation material encapsulating the underlying structures. The passivation may comprise silicon dioxide, and/or silicon nitride, and or silicon oxynitride, for example. As further shown, IC die 205 similarly has a front side 261B and a back side 262B that is separated from front side 261B by another semiconductor substrate 218B, and front-side circuit structures 216B. In this illustrated embodiment, IC die front side 261A is facing IC die front side 261B (e.g., with IC die 215 in a flip-chip configuration relative to IC die 205). Front-side circuit structures 216B again include a semiconductor device layer, one or more intra-die interconnect metallization levels, and a passivation material encapsulating the underlying structures.

Solder features 120A and 130A may comprise any solder known to be suitable for chip interconnection, such as, but not limited to, a Sn—Ag—Cu (SAC) alloy (e.g., "SAC 305" or "SAC 405"). Solder features 130A may have substantially the same composition, and/or same diameter as solder features 120A. However, solder features 130A are inoperable as electrical interconnects between IC die 215 and IC die 205 while solder features 120A are operable as electrical interconnects between IC die 215 and IC die 205. As shown, solder features 120A interface front-side circuit structures 216A to front-side circuit structures 216B. Solder features 120A are electrically insulated from each other (and from solder features 130A). In the illustrated example, an underfill 150 is between individual ones of solder features 120A and 130A. Underfill 150 may be any material known to be suitable for underfilling and/or over-molding of IC packages, such as, but not limited to, an epoxy resin (e.g., an acrylate of novolac).

Although solder features 130A are not electrically coupled to IC die 215 and/or IC die 205, solder features 130A are thermally coupled to IC die 215 and/or IC die 205. Thermal conductivity of package assembly 200 may be improved where solder features 130A are in close proximity to semiconductor substrate 218A and/or semiconductor substrate 218B, as semiconductors typically have thermal conductivity values exceeding those of dielectric materials present within front-side circuit structures 216A, 216B. In the illustrated examples, solder features 130A extend through at least a portion of front-side circuit structures 216A and 216B. For example, in some embodiments, solder features 130A extend through at least a passivation layer of front-side circuit structures 216A and 216B. In further embodiments, solder features 130A make contact with at least one of semiconductor substrate 218A or semiconductor substrate 218B. Thermal conductivity of package assembly 200 may be further improved where two or more solder features 130A are interconnected by one or more metallization layers, for example as described further below in the context of FIG. 3A, which illustrates an expanded view of an assembly region 300 demarked by dashed line in FIG. 2A.

In some embodiments, interconnection of an IC die to a package substrate includes interconnected thermal solder features. Package assembly 200, for example, further illustrates networked thermal solder features in accordance with embodiments where both die-to-die thermal solder features and die-to-substrate thermal solder features are networked. Notably, networked thermal solder features coupling a die to a package substrate may be present independent of any additional die-to-die networks (and vice versa). In the illustrated example, IC die back side 262B is facing package substrate 210. Substrate 210 may be any suitable material or laminate of materials. In the illustrated example, substrate 210 includes multiple conductive metal routing layers 233. Routing layers 233 may comprise copper, for example. Routing layers 233 may be embedded in any dielectric material, such as resinous films (e.g., GX-series films commercially available from Ajinomoto Fine-Techno Co., Inc).

Electrical solder features 120B couple substrate routing layers 233 to one or more electrical I/O ports of circuitry within IC chip 205. As illustrated, substrate 210 may comprise a fan-out region where traces within routing layers 233 extend beyond an edge of IC die 205.

Solder features 120B are operable as electrical interconnects between IC die 205 and package substrate 210. In the illustrated example, TSVs 165A electrically couple solder features 120B to front side IC structures 216B. Other die-to-substrate interconnects (e.g., wirebonds) may be present in the alternative to, or in addition to, TSVs 165A. TSVs 165A may comprise any suitable metal, such as, but not limited to, copper. Some TSVs may serve as thermal conduits that are coupled to one or more networked thermal solder feature. As shown in FIG. 2 for example, TSV 165B is interconnected with a thermal solder feature 130A. Such thermal TSVs may be insulated from electrical circuitry.

Solder features 120B and 130B may comprise any solder known to be suitable for package substrates, such as, but not limited to, SAC alloys. Solder features 130B may have substantially the same composition, and/or same diameter as solder features 120B. As shown, solder features 120B interface TSVs 165 to metal routing layers 233. Solder features 120B are electrically insulated from each other (and from solder features 130B). In the illustrated example, underfill 150 is again between individual ones of solder features 120B and 130B.

Solder features 130B are inoperable as electrical interconnects between IC die 205 and package substrate 210. Although solder features 130B are not electrically coupled to IC die 205 and/or substrate 210, solder features 130B are thermally coupled to IC die 205 and/or substrate 210. Thermal conductivity of package assembly 200 may be improved where solder features 130B are in close proximity to semiconductor substrate 218B and/or to substrate metal routing layers 233. In some embodiments, solder features 130B make contact with semiconductor substrate 218B. In some further embodiments, solder features 130B make contact with substrate routing layers 233. Thermal conductivity of package assembly 200 may be further improved where two or more solder features 130B are interconnected by one or more metallization layers, for example as described further below in the context of FIG. 3A.

Substrate 210 may be further coupled electrically (and thermally) by solder features 290 (e.g., solder balls or solder bumps), which may have any composition (e.g., SAC) and architecture suitable for coupling package substrate lands 222 to a host, such as a printed circuit board (not depicted) that may further comprise a laminate of electrical routing metallization layers embedded within dielectric layers over one or more sides of a core (e.g., FR-5 glass and epoxy or bismaleimide-triazine resin).

In some further embodiments, interconnection of an IC die to a package interposer includes interconnected thermal solder features. A package interposer may be any dummy chip (e.g., silicon), or the like internal to a package assembly that is other than IC die or package substrate suitable for interfacing to a host external of the package assembly. Solder features coupling an IC die to an interposer may include any of the networked thermal solder features illustrated above in accordance with either die-to-die thermal solder features or die-to-substrate thermal solder features. Notably, networked thermal solder features coupling a die to a package interposer may be present independent of any additional die-to-die thermal solder networks, die-to-substrate thermal solder networks, or interposer-to-substrate thermal solder networks.

Networked thermal solder features may have any spatial arrangement within a foot print of an IC die, package interposer, or package substrate. As shown in the plan view of FIG. 2B, thermal solder features 130A are intermixed with electrical solder features 120A within a footprint of IC die 215. Nearest neighboring thermal solder features 130A may be interconnected to each other with one, two, three, or more thermal conduits (e.g., metallized thermal routing features 240A). Likewise, nearest neighboring thermal solder features 130B may also be interconnected to each other with one, two, three, or more thermal conduits (e.g., metallized thermal routing features 240B).

In some embodiments, thermal solder features are interconnected by thermal conduits comprising one or more lateral routing features within one or more metallization layers of an IC die, a package substrate, or interposer. Such thermal routing features (e.g., traces, pads, planes, etc.) are electrically insulated from circuitry of an IC die, and/or from electrical solder features employed for IC die I/O. Metallized thermal routing features may be at any level of integration, including metal layers of an IC die, metal layers of a package substrate, or metal layers of an interposer.

Figure 3A:
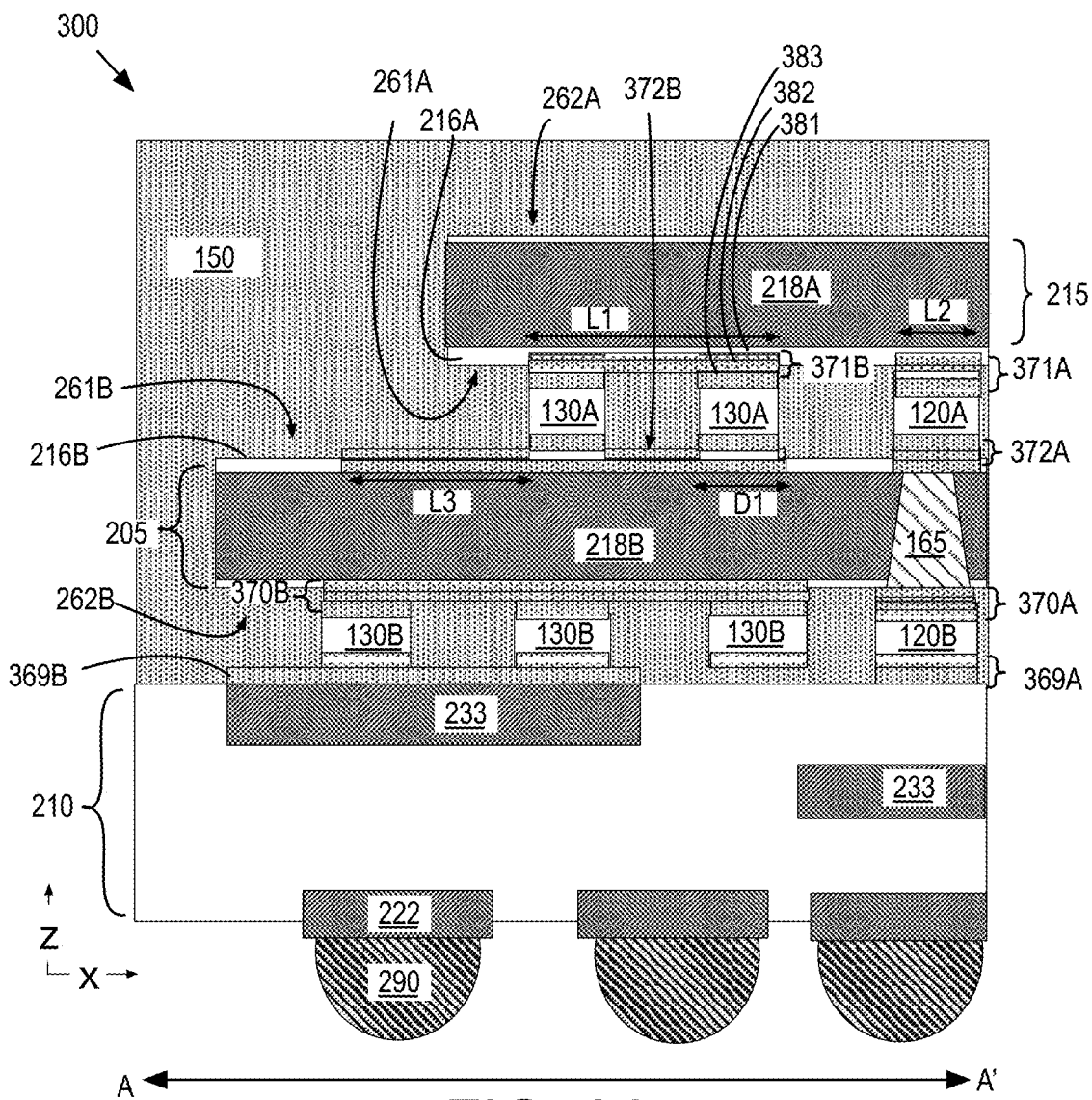
FIG. 3A is an expanded cross-sectional view of a region in the package assembly illustrated in FIG. 2A, in accordance with some embodiments.
Figure 3B:
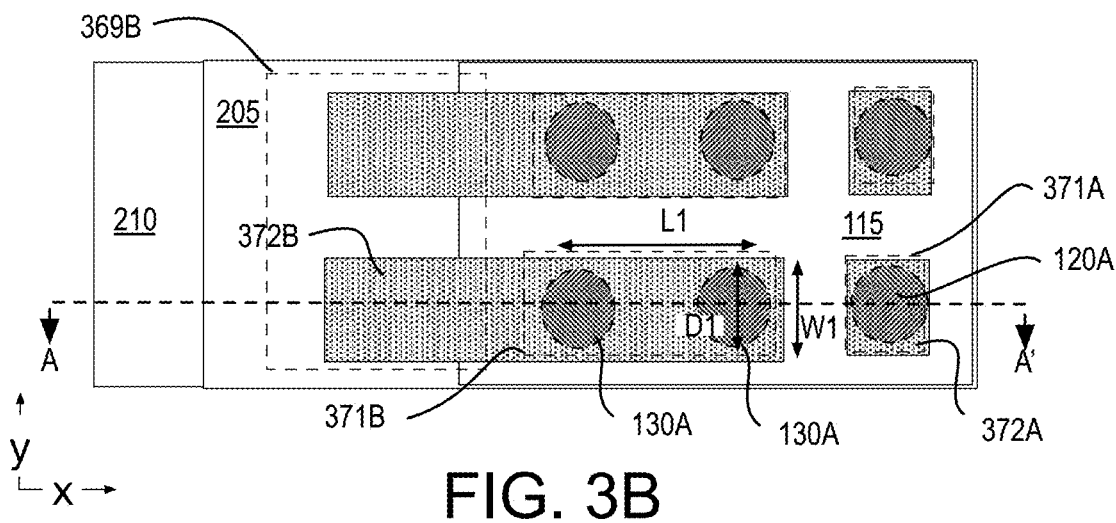
FIG. 3B is an expanded plan view of a region in the package assembly illustrated in FIG. 2A, in accordance with some embodiment.

FIG. 3A is an expanded cross-sectional view of the package assembly region 300 introduced in FIG. 2A, in accordance with some embodiments where thermal routing features comprise an under bump metallization (UBM) that is between a semiconductor substrate of an IC die, and an underfill material of a package assembly. FIG. 3B is an expanded plan view of the package assembly region 300, in accordance with some embodiments.

As shown in FIG. 3A, electrical solder feature 120A is a (micro)bump or cap coupled to IC die 215 through an UBM 371A. Solder feature 120A is further coupled to IC die 205 through another UBM 372A. UBM 371A and 372A may each comprise one or more metals, layers thereof, and/or alloys thereof UBM 371A may have substantially the same composition(s) and/or layer architecture as UBM 372A, or may be different. In some exemplary embodiments, at least one of UBM 371A and UBM 372A includes copper (Cu). The copper may be a seed layer 382, for example suitable for electrochemical deposition of solder feature 120A. The UBM 371A and 372A may further include one or more other metals, such as an adhesion layer between IC die 215 and/or IC die 205, respectively. As one example, at least one of UBM 371A and 372A that includes Cu further includes titanium (Ti). In the illustrated example, an adhesion layer 381 (e.g., Ti) is between seed layer 382 (e.g., Cu) and IC die 215, and/or IC die 205, for example. The UBM 371A and 372A may further include one or more other metals, for example a surface finish 383 suitable for solder features. In one embodiment, at least one of UBM 371A and 372A that includes Cu further includes nickel (Ni). A Ni or Ni-alloy surface finish 383 may be over seed layer 382, for example. The thickness of UBM 371A and 372A may therefore vary, for example from 2-5 μm to tens of microns.

Thermal solder features 130A are similarly (micro)bumps or caps coupled to IC die 215 through UBM 371B, and coupled to IC die 205 through UBM 372B. UBM 371B and 372B may each comprise one or more metals, layers thereof, and/or alloys thereof. In some embodiments, UBM 371B and UBM 372B have substantially the same composition(s) and/or layer architecture as UBM 371A and 372A, respectively. In some exemplary embodiments, one or more UBM features interconnect two or more thermal solder features. As shown in FIG. 3A and 3B, UBM 371B has a length Li that exceeds a diameter D1 of single solder feature 130A, and more specifically exceeds the diameter of a UBM associated with a single solder feature (i.e., L1>L2). In advantageous embodiments, UBM feature length L1 is sufficient to interconnect two adjacent solder features 130A, improving thermal conduction therebetween. Although solder feature diameters may vary and can be expected to scale, in some embodiments where solder features 120A and/or 130A have a diameter of 100 µm, or less, UBM feature length L1 is at least 300 µm, and may be 500 µm, or more. UBM 371B may have any feature width W1. Width W1 may be substantially the same as a critical dimension (CD) of UBM 371A, for example. In the example shown, UBM 371B is a trace having substantially longer length L1 than width W1. In other embodiments however, a UBM solder interconnect feature may have substantially equal length and width.

As noted above, thermal solder features are electrically insulated from electrical solder features. In the example shown in FIG. 3A and 3B, underfill 150 surrounds electrical solder feature 120A and UBM 371A (372A). One or more materials of circuit structures 216A and 216B (e.g., IC die passivation) may further ensure solder feature 120A is electrically coupled only to circuitry on IC die 215 (and IC die 205). Underfill 150, and one or more materials within circuit structures 216A, 216B, therefore electrically insulate solder features 120A from thermal solder features 130A.

In some embodiments, interconnected thermal solder features are in close proximity to the semiconductor substrate of an IC die. In the example illustrated in FIG. 3A, UBM 371B is between semiconductor substrate 318 and underfill 150, and UBM 371B may be at least partially embedded within IC die 215. For example, in some embodiments one or more materials of circuit structures 216A (e.g., IC die passivation material) present in other regions of IC die 215 are absent within the area occupied by UBM 371B. In the absence of passivation material (e.g., SiO2, SiN, SiON), thermal resistance between UBM 371B and semiconductor substrate 218A may be reduced. UBM 371B may also be in direct contact with semiconductor substrate 218A, eliminating any thermal resistance associated with circuit structures 216A, and potentially further reducing thermal resistance within the plane of IC die 205 (and reducing the total resistance of assembly region 300).

In some embodiments, multiple thermal solder features may be interconnected by a first thermal routing feature on a first IC die, and a second thermal routing feature on a second IC die. Such parallel thermal conduits may work together to reduce hot spots originating within either the first or second IC die. Such parallel thermal conduits may increase thermal conductivity through their greater combined cross-sectional area (thickness and/or lateral dimensions) of the routing features. In the example shown in FIG. 3A, in addition to UBM 371B, thermal vias 130A are also laterally interconnected by UBM 372B. UBM 372B may, for example, have the same compositions and/or architecture as UBM 372A, but is again electrically insulated from UBM 372A and/or electrical solder feature 120A. Although the interconnection of thermal solder features by two metallization layers is illustrated in FIG. 3A, it is noted that a package assembly need not have such parallel thermal conduits, and solder interconnect may instead include only one metallization layer (e.g., UBM 371B or UBM 372B).

In some embodiments, lateral thermal routing features extend into regions of a die, interposer, or package substrate that are beyond a perimeter of another IC die interconnected by the thermal solder features. Such thermal routing features may, for example, serve as a better heat conduit than other materials adjacent to an edge of an IC die. As further illustrated in FIG. 3A, UBM 372B extends a length L3 from a thermal solder feature 130A over a region of IC die 205 that is beyond an edge of IC die 215. UBM 372B may therefore spread heat received through solder feature 130A (e.g., from IC die 215) into the perimeter region of the larger area of IC die 205. Total thermal resistance between IC die 215 and IC die 205 may therefore be reduced from a reference resistance associated primarily with the relatively poor thermal conductivity (e.g., <1 W/mK) of underfill 150.

In some embodiments, a package assembly includes networked thermal solder features within multiple planes of the package assembly. For example, multiple IC die of a package may each include thermal solder features that are interconnected within a plane of each IC die. In another example, an IC die and a package interposer or package substrate may each include thermal solder features that are interconnected within each plane. The multiple planes of interconnect may laterally connect the same solder features, or may laterally connect separate, different solder features.

In the embodiments represented by FIG. 3A, thermal solder features 130B are laterally interconnected with a metallization on a backside of IC die 205. For some such embodiments, a UBM may include, or be in contact with, a TSV metallization (e.g., TSV pad). The TSV metallization layer may be further in contact with a TSV, or not. For example, TSV 165 is further coupled to a UBM 370A that may be in contact with a back side pad intersected by TSV 165. UBM 370B may also be in contact with a similar back side pad (even in the absence of another TSV). UBM 370A and 370B may be of any suitable compositions and architectures. In some examples, UBM 370A and 370B have substantially the same composition as one or more of UBM 371A, UBM 371B, UBM 372A, or UBM 372B. Therefore, UBM 370B may be in close proximity to semiconductor substrate 218B (e.g., with no passivation or other dielectric material therebetween) for low thermal resistance. Although not depicted, thermal TSVs may be further coupled to UBM 370B (e.g., through the TSV pad metallization) to improve thermal conductivity through semiconductor substrate 218B and link interconnected thermal solder features of one plane with those of another plane.

FIG. 3A further illustrates an exemplary package assembly region 300 where IC die 205 is coupled to both IC die 215 and package substrate 210, each of which includes interconnected solder features. As shown, an IC die back side 262B is coupled by both electrical solder features 120B and thermal solder features 130B. Multiple thermal solder features 130B are interconnected by package substrate metallization features 369B, which are in contact with a substrate metal routing (e.g., redistribution or fan-out) layer 233. In this example, at least some portion of a fan-out region of substrate 210 is therefore utilized for non-electrical, thermal conduit routes/fan-outs. Electrical solder features 120B interconnect IC die 205 to substrate 210 (e.g., through TSV 165 and UBM 370A). Underfill 150 again insulates solder features 120B from each other, and from thermal solder features 130B. As shown, package substrate metallization features 369B provide a parallel thermal conduit between a subset of the solder features 130B interconnect by UBM 370B, emphasizing that lateral interconnects on either side of a thermal solder feature may vary to achieve a desired thermal uniformity within separate planes of a package substrate.

Figure 4:
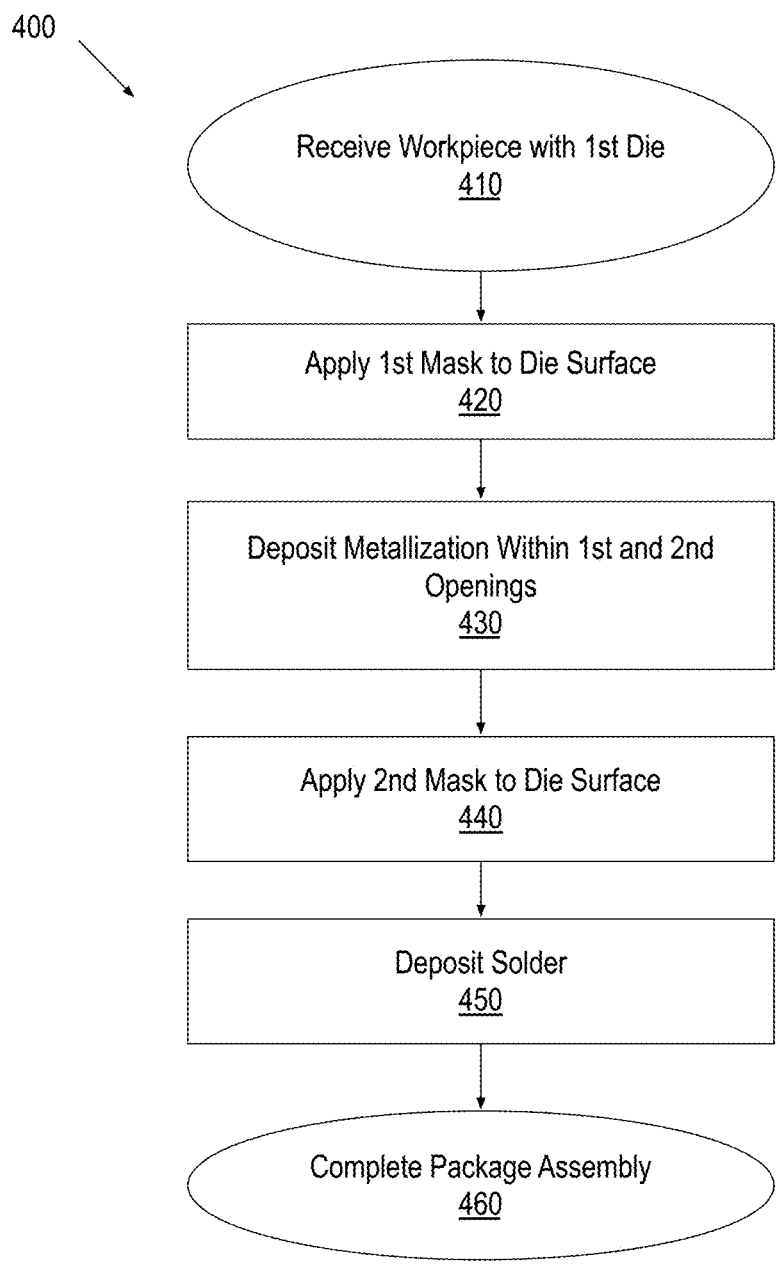
FIG. 4 is a flow diagram illustrating a method of forming a package assembly that includes thermal solder feature networks, in accordance with some embodiments.
Figure 5A:
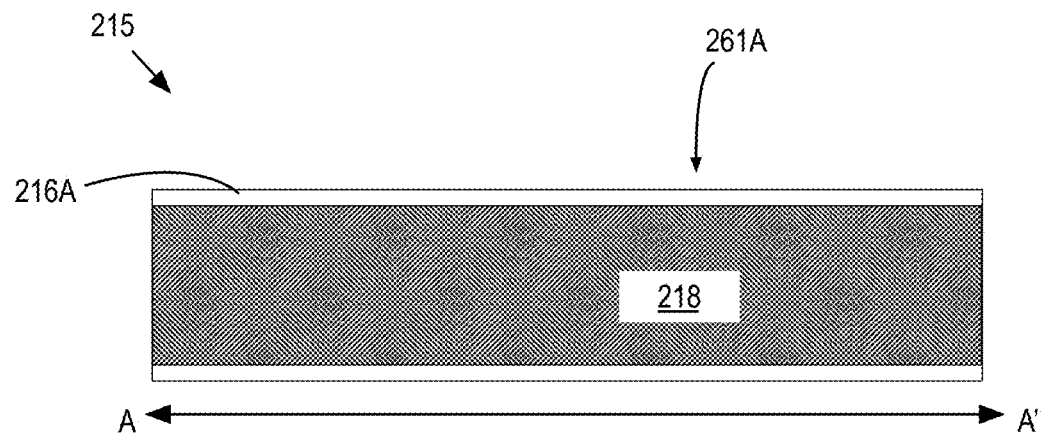
FIG. 5A, 5B, 5C, 5D, and 5E illustrate a cross-sectional view of a package assembly evolving to include thermal solder feature networks as selected operations of an assembly method are performed, in accordance with some embodiments.
Figure 5B:
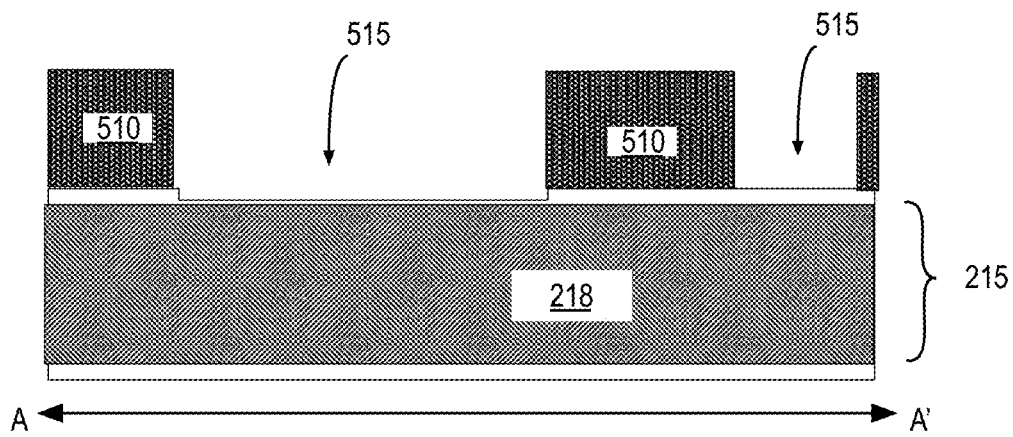
Figure 5C:
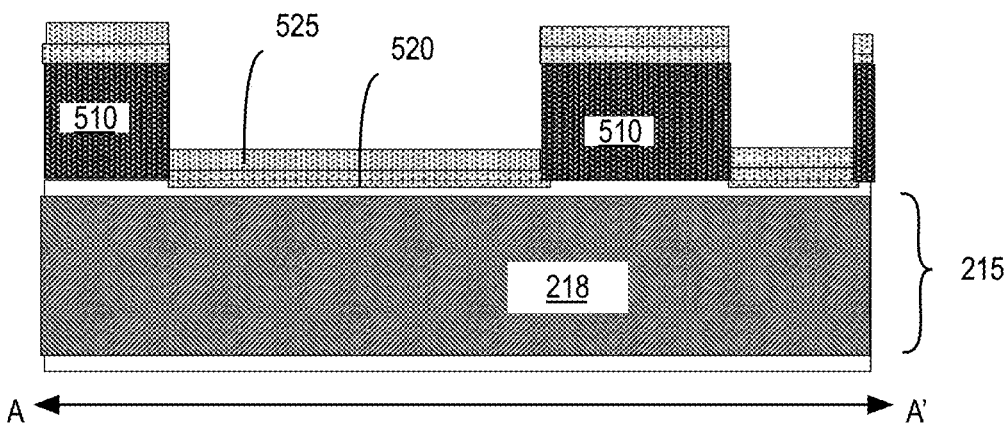
Figure 5D:
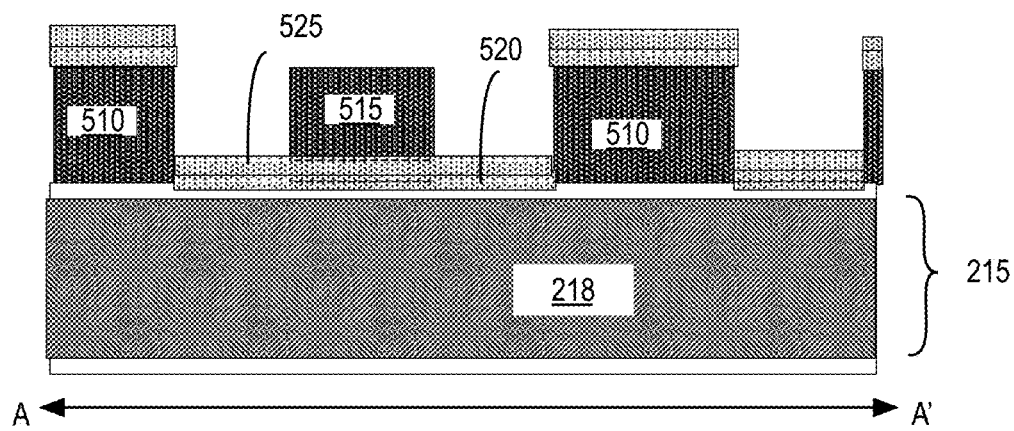
Figure 5E:
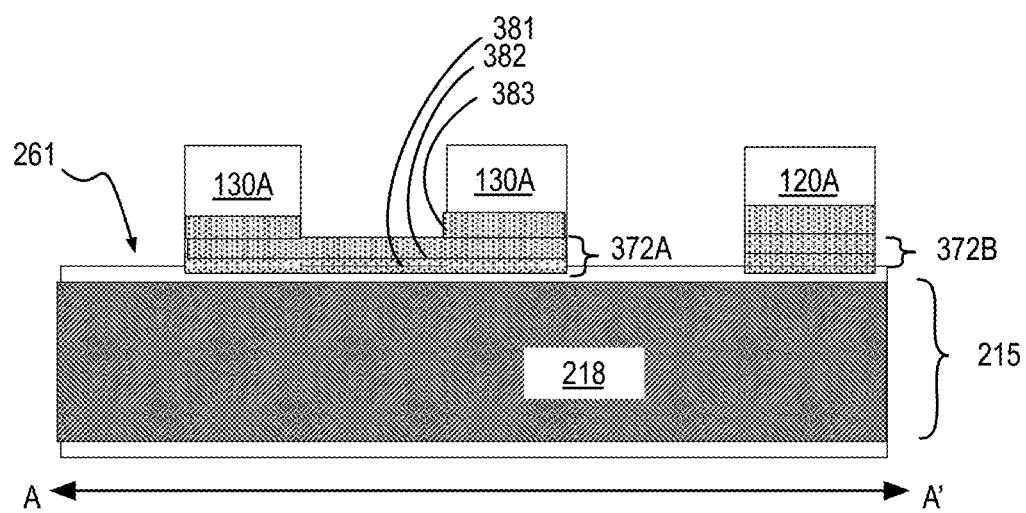

The package assemblies described above may be fabricated using a variety of methods. FIG. 4 is a flow diagram illustrating some exemplary methods 400 for fabricating a package assembly, in accordance with some embodiments.

FIG. 5A, 5B, 5C, 5D, and 5E are cross-sectional views of a package assembly evolving as selected operations of the methods 400 are performed, in accordance with some illustrative embodiments.

Referring first to FIG. 4, methods 400 begin at operation 410 where first IC die are received as a workpiece. The workpiece may, for example, comprise singulated, known-good chips mounted upon a carrier as reconstituted wafer, for example with any suitable pick-and-place technique. IC chips may be affixed to a carrier, for example with an adhesive, or by any other means known to be suitable for preparing a package assembly. In the example illustrated in FIG. 5A, a workpiece includes IC die 215 with front side surface 261A exposed for further processing.

Returning to FIG. 4, methods 400 continue at operation 420 where a first mask is applied to the front side die surface. In some exemplary embodiments, the masking operation 420 is to define both electrical solder features and interconnects for thermal solder features. The first mask may utilize any mask material formed by any masking technique(s) known to be suitable for forming bump metallization. In the example further illustrated in FIG. 5B, a mask material 510 has been applied to front side 261A, and openings 515 have been patterned into mask material 510. At least some material layer of circuit structures 216A is removed within one or more of the mask openings where thermal solder interconnects are to be formed. In some exemplary embodiments, at least a passivation dielectric (e.g., SiO, SiN, SiON) is etched from circuit structures 216A where such material is exposed within openings 515. Such a passivation material etch may be selective to metallization of circuit structures 216A that may be present within openings where electrical solder features are to be formed.

Returning to FIG. 4, methods 400 continue at operation 430 where under-bump metallization is deposited within the mask openings that were formed at operation 420. Any metallization known to be suitable for (micro)bump fabrication may be deposited at operation 430. In the example further illustrated in FIG. 5C, an adhesion layer 381 (e.g. comprising Ti) is deposited over IC die 215, for example with any suitable sputter deposition process. A seed layer 383 (e.g., comprising Cu) is deposited over adhesion layer 520, for example with any suitable sputter or electroless deposition process. The under-bump metallization may be deposited to any desired depth, for example to form Cu pillars of a desired height in a microbump process.

Returning to FIG. 4, methods 400 continue at operation 440 where a second mask is applied to the IC die surface. The second mask is to further restrict subsequently formed solder features to some partial region of the under-bump metallization formed at operation 430. Any masking material and masking process known to be suitable for (micro) bump manufacture may be employed at operation 440. In the example further illustrated in FIG. 5D, mask 515 bifurcates one of the previously formed mask openings.

Returning to FIG. 4, methods 400 continue at operation 450 where solder is deposited to form both electrical and thermal solder features. At operation 450 any solder composition may be deposited by any suitable technique (e.g., electrochemical deposition) to form solder features within the mask openings. Solder feature formation may include the deposition of one or more metals in addition to solder, such as, but not limited to, a surface finish. In the example further illustrated in FIG. 5E, surface finish 383 (e.g., comprising Ni) is deposited on seed layer 382, and solder features 130A are deposited over surface finish 383 to arrive at the interconnected thermal solder features described above, along with electrical solder features 120A.

Methods 400 (FIG. 4) are then completed at operation 460 where any suitable assembly procedures may be performed to further affix the IC die to one or more of another IC die, interposer, or package substrate. Methods 400 may be iterated, for example to prepare multiple IC die in substantially the same manner, and the resulting components then interconnected as distinct package assembly planes by reflowing the solder. For example, multiple components fabricated according to methods 400 may be assembled into package assembly 200 (FIG. 2A) by reflowing their respective solder features. At operation 460, one or more molding process may be performed to apply underfill between planes of the package assembly, and between individual ones of the solder features.

Figure 6:
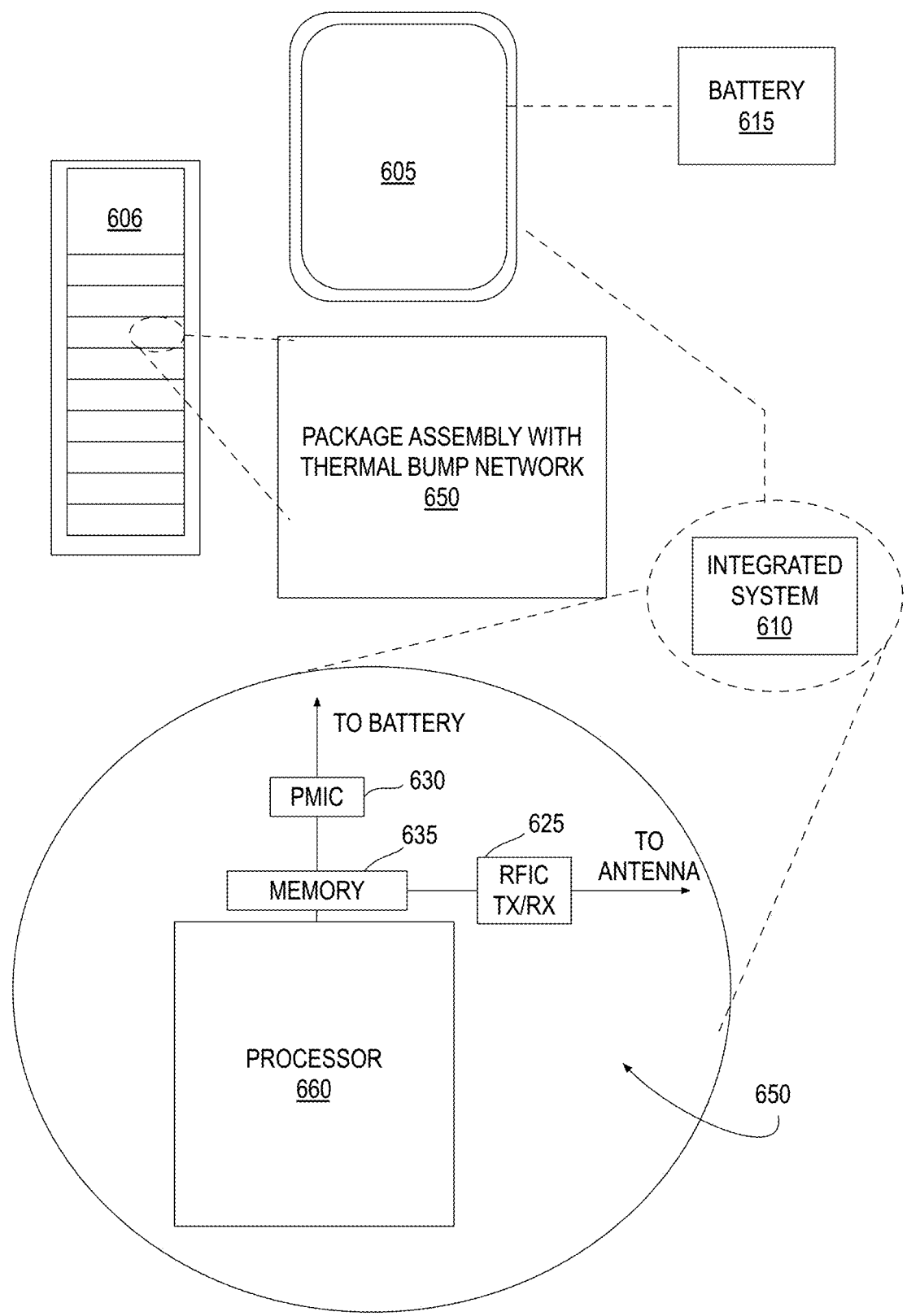
FIG. 6 illustrates a mobile computing platform and a data server machine employing a package assembly that includes thermal solder feature networks, in accordance with some embodiments.

FIG. 6 illustrates a mobile computing platform and a data server machine employing a package assembly including laterally interconnected thermal solder features, for example as described elsewhere herein. The server machine 606 may be any commercial server, for example including any number of high-performance computing platforms disposed within a rack and networked together for electronic data processing, which in the exemplary embodiment includes a packaged monolithic SoC 650. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level or package-level integrated system 610, and a battery 615.

As a system component within the server machine 606, an IC device package assembly 650 may include a memory die (e.g., RAM) 635 and a processor die 660 (e.g., a microprocessor, a multi-core microprocessor, graphics processor, or the like) contained within a single package assembly that includes laterally interconnected thermal solder features, for example as described elsewhere herein. Package assembly 650 further includes a package substrate to which one or more of a power management integrated circuit (PMIC) die 630, RF (wireless) integrated circuit (RFIC) die 625 including a wideband RF (wireless) transmitter and/or receiver (TX/RX), and memory die 635 are interconnected through thermal and electrical solder connections. One or more heatsinks (not depicted) may be affixed to IC device package assembly 650.

Functionally, PMIC 630 may perform battery power regulation, DC-to-DC conversion, etc., and so has an input coupled to battery 615 and with an output providing a current supply to other functional modules of package assembly 650. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, one or more of these die-level IC modules may be integrated onto separate packages, or integrated into a monolithic SoC.

Figure 7:
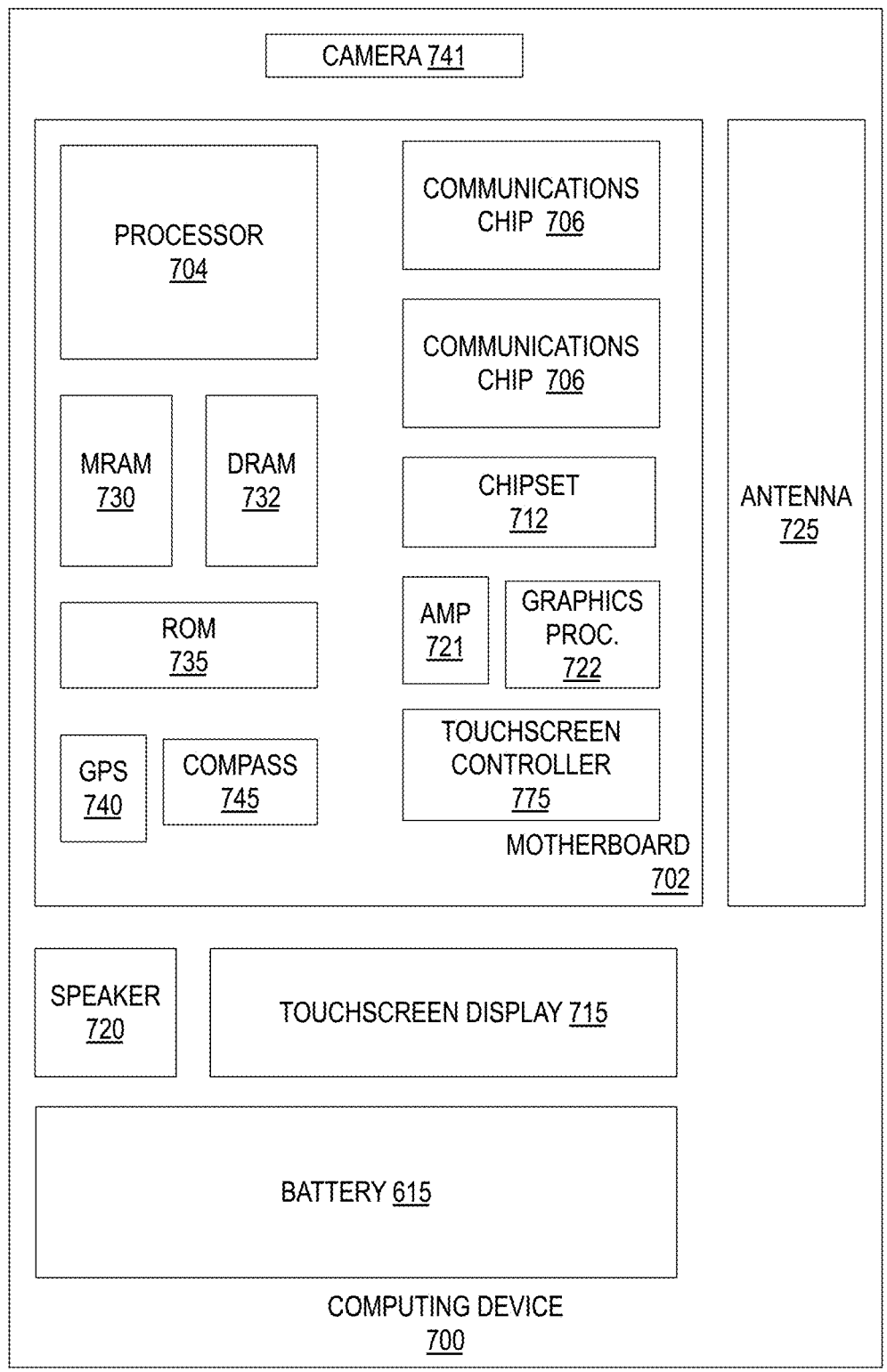
FIG. 7 is a functional block diagram of an electronic computing device, in accordance with some embodiments.

FIG. 7 is a functional block diagram of an electronic computing device, in accordance with some embodiments. Computing device 700 may be found inside platform 605 or server machine 606, for example. Device 700 further includes a motherboard 702 hosting a number of components, such as, but not limited to, a processor 704 (e.g., an applications processor), which may be contained within a package assembly including laterally interconnected thermal solder features, for example as described elsewhere herein. Processor 704 may be physically and/or electrically coupled to motherboard 702. In some examples, processor 704 includes an integrated circuit die, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., MRAIVI 730), flash ROM 735, a graphics processor 722, a digital signal processor, a crypto processor, a chipset 712, an antenna, 725, touchscreen display 715, touchscreen controller 775, battery 615, audio codec, video codec, power amplifier 721, global positioning system (GPS) device, 740 compass 745, accelerometer, gyroscope, speaker 720, camera 741, and mass storage device (such as hard disk drive, solid-state drive (SSD), compact disk (CD), digital versatile disk (DVD), and so forth), or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In first examples, an integrated circuit (IC) assembly comprises a die comprising an IC, and a second die, interposer, or package substrate. The IC is electrically coupled by first solder features to the second die, interposer, or package substrate. The IC is thermally coupled by second solder features to the second die, interposer, or package substrate. The second solder features are electrically insulated from the first solder features. The second solder features are interconnected to each other by a metallization trace on at least one of the die, second die, interposer, or package substrate.

In second examples, for any of the first examples the metallization trace is on at least one of the die or second die. The die comprises a front side, and a back side, and a first semiconductor substrate therebetween. The second die comprises a front side, and a back side, and a second semiconductor substrate therebetween. The assembly further comprises an underfill comprising a dielectric material, the underfill between individual ones of the second solder features. The metallization trace is between the underfill and at last one of the first or second semiconductor substrates.

In third examples for any of the second examples the second solder features are coupled to the die through the metallization trace. The underfill is between individual ones of the first solder features. The metallization trace is electrically insulated from the first solder features by at least the underfill.

In fourth examples, for any of the third examples, the first solder features are coupled to the die through an under bump metallization (UBM). The metallization trace comprises the UBM.

In fifth examples, for any of the second through fourth examples, the metallization trace is a first metallization trace on the die. The second solder features are additionally coupled to each other through a second metallization trace on the second die.

In sixth examples, for any of the second through fifth examples, the metallization trace is on the die. The second solder features thermally couple the die to the second die, and the second die further comprises a second IC. Third solder features electrically couple the second IC to an interposer, or package substrate. Fourth solder features thermally couple the second IC to the interposer, or package substrate. The fourth solder features are electrically insulated from the third solder features. The fourth solder features are interconnected to each other by a second metallization trace on at least one of the second die, interposer, or package substrate.

In seventh examples, for any of the sixth examples, the first solder features are coupled to the die through an under bump metallization (UBM). The metallization trace comprises the UBM. The second solder features are coupled to the second die through the metallization trace. The third solder features are coupled to the die through second UBM. The second metallization trace comprises the second UBM.

In eighth examples, for any of the second through seventh examples, the second solder features are coupled to the back side through the metallization trace. The assembly further comprises a through-substrate via between the IC and the metallization trace.

In ninth examples, for any of the first through eighth examples the second solder features are interconnected to each other by a metallization trace on the second die, interposer, or package substrate.

In tenth examples, for any of the ninth examples the second die, interposer, or package substrate has a larger area than the die. The second solder features are electrically interconnected to each other by a metallization trace that extends into a portion of the second die, interposer, or package substrate that is beyond an edge of the die.

In eleventh examples, for any of the ninth examples the metallization trace comprises a redistribution layer of the interposer, or package substrate.

In twelfth examples, for any of the first through eleventh examples, the second solder features have a diameter no more than 100 µm. The metallization trace comprises a first segment having a length of at least 300 μm between a first and second of the second solder features, and a second segment having a length of at least 500 μm between the second of the second solder features and a third of the second solder features.

In thirteenth examples, an integrated circuit (IC) device package comprises a package substrate and first die comprising a first IC. The first die is coupled to the package substrate. The package further comprises a second die comprising a second IC. First solder features electrically couple the first IC to the second IC. Second solder features thermally couple the first IC to the second IC. The second solder features are electrically insulated from the first solder features. The second solder features are interconnected to each other by a metallization trace on at least one of the first die, or second die.

In fourteenth examples, for any of the thirteenth examples the package substrate has a larger area than the first die. The first die has a larger area than the second die. The first die is between the package substrate and the second die. The second solder features are electrically interconnected to each other by a metallization trace that extends into a portion of the first die that is beyond an edge of the second die.

In fifteenth examples, for any of the fourteenth examples the metallization trace is on the first die. Third solder features electrically couple the second IC to the package substrate. The first IC comprises a volatile or non-volatile electronic memory. The second IC comprises a floating point gate array, or microprocessor.

In sixteenth examples, for any of the fifteenth examples the first solder features are coupled to the first die through an under bump metallization (UBM). The metallization trace comprises the UBM. The second solder features are coupled to the first die through the metallization trace.

In seventeenth examples a system comprises the device package of the thirteenth examples. The system comprises a heatsink coupled to the IC device package, and a power supply coupled to the device package to power the first and second ICs.

In eighteenth examples, a method of fabricating an integrated circuit (IC) device package, the method comprises receiving a die, the die comprising an integrated circuit (IC) over a semiconductor substrate. Patterning a plurality of first openings within a passivation material, the first openings exposing electrical interconnects of the IC. Patterning a plurality of second openings within the passivation material, the second openings exposing the semiconductor substrate. Forming an under-bump metallization (UBM) in the first and second openings. Forming a first solder feature over the UBM within each of the first openings. Forming a second and third solder features over the UBM within each of the second openings, the second and third solder features interconnected by the UBM. Depositing an underfill around the first, second and third solder features, the underfill electrically insulating the first solder feature from the second and third solder features.

In nineteenth examples, for any of the eighteenth examples forming the UBM within the second opening comprises plating at least Cu within openings of a first mask, and forming the second and third solder features comprises plating at least solder within a pair of openings in second mask, the second openings aligned to the UBM.

In twentieth examples for any of the nineteenth examples the second openings are laterally spaced apart by at least 500 μm, and the second and third solder features have a diameter no more than 100 μm.

It will be recognized that principles of the disclosure are not limited to the embodiments so described, but can be practiced with modification and alteration without departing from the scope of the appended claims. For example the above embodiments may include specific combinations of features as further provided below.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:
1. An integrated circuit (IC) assembly, comprising:
a die comprising an IC; and
a second die, interposer, or package substrate;
wherein:
the IC is electrically coupled by a plurality of electrical solder features to the second die, interposer, or package substrate;
the IC is thermally coupled by second a plurality of thermal solder features to the second die, interposer, or package substrate;
and
two or more of the thermal solder features are interconnected to each other by a metallization trace on at least one of the die, second die, interposer, or package substrate.

2. The assembly of claim 1, wherein:
the metallization trace is on at least one of the die or second die;
the die comprises a front side, and a back side, and a first semiconductor substrate therebetween;
the second die comprises a front side, and a back side, and a second semiconductor substrate therebetween;
the assembly further comprises an underfill comprising a dielectric material, the underfill between individual ones of the thermal solder features; and
the metallization trace is between the underfill and at least one of the first or second semiconductor substrates.

3. The assembly of claim 2, wherein:
the thermal solder features are coupled to the die through the metallization trace;
the underfill is between individual ones of the electrical solder features; and
the metallization trace is electrically insulated from the electrical solder features by at least the underfill.

4. The assembly of claim 3, wherein:
the electrical solder features are coupled to the die through an under bump metallization (UBM); and
the metallization trace comprises the UBM.

5. The assembly of claim 2, wherein:
the metallization trace is a first metallization trace on the die; and
the thermal solder features are additionally coupled to each other through a second metallization trace on the second die.

6. The assembly of claim 2, wherein:
the metallization trace is on the die;
the thermal solder features thermally couple the die to the second die; and the second die further comprises a second IC, wherein:
- a plurality of second electrical solder features electrically couple the second IC to an interposer, or package substrate;
- a plurality of second thermal solder features thermally couple the second IC to the interposer, or package substrate; and
- two or more of the second thermal solder features are interconnected to each other by a second metallization trace on at least one of the second die, interposer, or package substrate.

7. The assembly of claim 6, wherein:
the electrical solder features are coupled to the die through an under bump metallization (UBM);
the metallization trace comprises the UBM;
the thermal solder features are thermally coupled to the second die through the metallization trace;
the second electrical solder features are electrically coupled to the die through second UBM; and
the second metallization trace comprises the second UBM.

8. The assembly of claim 2, wherein:
the thermal solder features are coupled to the back side through the metallization trace; and
the assembly further comprises a through-substrate via between the IC and the metallization trace.

9. The assembly of claim 1, wherein the thermal solder features are interconnected to each other by a metallization trace on the second die, interposer, or package substrate.

10. The assembly of claim 9, wherein:
the second die, interposer, or package substrate has a larger area than the die; and
the thermal solder features are electrically interconnected to each other by a metallization trace that extends into a portion of the second die, interposer, or package substrate that is beyond an edge of the die.

11. The assembly of claim 9, wherein the metallization trace comprises a redistribution layer of the interposer, or package substrate.

12. The assembly of claim 1, wherein:
the thermal solder features have a diameter no more than 100 µm;
the metallization trace comprises a first segment having a length of at least 300 µm between a first and second of the second solder features, and a second segment having a length of at least 500 µm between the second of the second solder features and a third of the second solder features.

13. An integrated circuit (IC) device package, comprising:
a package substrate;
a first die comprising a first IC, wherein the first die is coupled to the package substrate; and
a second die comprising a second IC, wherein:
- a plurality of electrical solder features electrically couple the first IC to the second IC;
- a plurality of thermal solder features thermally couple the first IC to the second IC;
- two or more of the thermal solder features are interconnected to each other by a metallization trace on at least one of the first die, or second die.

14. The IC device package of claim 13, wherein:
the package substrate has a larger area than the first die;
the first die has a larger area than the second die;
the first die is between the package substrate and the second die; and
the thermal solder features are electrically interconnected to each other by a metallization trace that extends into a portion of the first die that is beyond an edge of the second die.

15. The IC device package of claim 14, wherein:
the metallization trace is on the first die;
a plurality of second electrical solder features electrically couple the second IC to the package substrate;
the first IC comprises a volatile or non-volatile electronic memory; and
the second IC comprises a floating point gate array, or microprocessor.

16. The device package of claim 15, wherein:
the electrical solder features are coupled to the first die through an under bump metallization (UBM);
the metallization trace comprises the UBM; and
the thermal solder features are coupled to the first die through the metallization trace.

17. A system comprising:
the device package of claim 13;
a heatsink coupled to the IC device package; and
a power supply coupled to the device package to power the first and second ICs.

18. An integrated circuit (IC) assembly, comprising:
a die comprising an IC; and
a second die, interposer, or package substrate;
wherein:
- the IC is electrically coupled by first solder features to the second die, interposer, or package substrate through an under bump metallization (UBM);
- the IC is thermally coupled by second solder features to the second die, interposer, or package substrate;
- at least two of the second solder features are interconnected to each other by a metallization trace of at least one of the die, second die, interposer, or package substrate; and
- the metallization trace comprises the UBM.

19. The IC assembly of claim 18, wherein individual ones of the first solder features are electrically connected to both power and signal input/output (I/O) of the IC, and individual ones of the second solder features are each electrically isolated from the power and signal I/O of the IC.

20. The IC assembly of claim 19, wherein the second solder features are electrically floating or coupled to a ground plane of the die, second die, interposer, or package substrate.

* * * * *